United States Patent
Bruckhaus

(10) Patent No.: US 11,506,515 B2
(45) Date of Patent: Nov. 22, 2022

(54) CONTROL UNIT COMPRISING A CIRCUIT, AND METHOD FOR SHORT-CIRCUIT PROTECTION OF GROUND LINES AND SENSORS

(71) Applicant: Robert Bosch GmbH, Stuttgart (DE)

(72) Inventor: Tim Bruckhaus, Asperg (DE)

(73) Assignee: Robert Bosch GmbH, Stuttgart (DE)

(*) Notice: Subject to any disclaimer, the term of this patent is extended or adjusted under 35 U.S.C. 154(b) by 184 days.

(21) Appl. No.: 16/639,438

(22) PCT Filed: Aug. 9, 2018

(86) PCT No.: PCT/EP2018/071584
§ 371 (c)(1),
(2) Date: Feb. 14, 2020

(87) PCT Pub. No.: WO2019/034510
PCT Pub. Date: Feb. 21, 2019

(65) Prior Publication Data
US 2021/0164810 A1 Jun. 3, 2021

(30) Foreign Application Priority Data
Aug. 15, 2017 (DE) .................... 10 2017 214 205.7

(51) Int. Cl.
*G01R 31/52* (2020.01)
*G01D 5/18* (2006.01)
(Continued)

(52) U.S. Cl.
CPC .......... *G01D 5/18* (2013.01); *G01D 5/24466* (2013.01); *G01R 31/006* (2013.01); *G01R 31/52* (2020.01)

(58) Field of Classification Search
CPC ........ G01D 5/18; G01D 5/24466; H02H 3/08; H02H 3/085; H02H 3/087; H02H 3/10;
(Continued)

(56) References Cited

U.S. PATENT DOCUMENTS

| 5,294,890 A * | 3/1994 | Hemminger ....... G01R 31/2829 204/401 |
| 6,130,813 A | 10/2000 | Kates et al. |

(Continued)

FOREIGN PATENT DOCUMENTS

| CN | 1292603 A | 4/2001 |
| CN | 1783705 A | 6/2006 |

(Continued)

OTHER PUBLICATIONS

International Search Report for Application No. PCT/EP2018/071584 dated Jan. 2, 2019 (English Translation, 4 pages).

*Primary Examiner* — Patrick Assouad
*Assistant Examiner* — Demetrius R Pretlow
(74) *Attorney, Agent, or Firm* — Michael Best & Friedrich LLP

(57) ABSTRACT

The invention relates to a control unit (6) for evaluating the sensor signal of a sensor (2), comprising at least one first sensor connection (21) and a second sensor connection (22) for connecting the sensor (2), wherein the second sensor connection (22) is connected to a short-circuit protection circuit (23), which is arranged between the second sensor connection (22) and a grounding (3), and which comprises a switchable transistor (7), by way of which the grounding (3) of the second sensor connection (22) can be interrupted.

14 Claims, 1 Drawing Sheet

(51) Int. Cl.
*G01D 5/244* (2006.01)
*G01R 31/00* (2006.01)

(58) Field of Classification Search
CPC .......... H02H 3/105; H02H 3/16; H02H 3/162; H02H 3/167; G01R 31/52; G01R 31/50
See application file for complete search history.

(56) References Cited

U.S. PATENT DOCUMENTS

| | | | |
|---|---|---|---|
| 6,208,175 B1* | 3/2001 | Zydek | B60R 16/03 327/75 |
| 7,154,718 B1* | 12/2006 | Finlay, Sr. | H01H 83/04 361/42 |
| 7,276,901 B2* | 10/2007 | Klein | G01K 7/16 324/252 |
| 7,280,333 B2* | 10/2007 | Horsky | H02H 3/087 361/93.1 |
| 7,532,010 B2* | 5/2009 | Kamel | G01D 3/08 324/503 |
| 10,371,736 B2* | 8/2019 | Zarabadi | F02D 41/222 |
| 10,788,541 B2* | 9/2020 | Zarabadi | F02D 41/222 |
| 2004/0195097 A1* | 10/2004 | Suzuki | G01N 27/4071 204/426 |
| 2005/0083616 A1* | 4/2005 | Reid | H02H 3/331 361/42 |
| 2006/0036381 A1* | 2/2006 | Klein | G01K 7/16 702/64 |
| 2006/0145059 A1* | 7/2006 | Lee | H04R 23/00 250/214 R |
| 2008/0074117 A1* | 3/2008 | Kamel | G01D 3/08 324/503 |
| 2008/0080106 A1* | 4/2008 | Mirafzal | H02M 1/12 361/42 |
| 2009/0198459 A1* | 8/2009 | Bilac | H02H 1/0015 702/58 |
| 2009/0279217 A1* | 11/2009 | Curl | H02H 3/334 361/42 |
| 2012/0033337 A1 | 2/2012 | Gruber | |
| 2013/0234744 A1* | 9/2013 | Carbonaro | G01R 31/50 324/750.03 |
| 2013/0249564 A1* | 9/2013 | Ripley | G01R 31/52 324/509 |
| 2018/0231434 A1* | 8/2018 | Hotta | F02D 45/00 |
| 2018/0366291 A1* | 12/2018 | Jiao | H02H 3/021 |

FOREIGN PATENT DOCUMENTS

| | | | |
|---|---|---|---|
| CN | 101350514 A | 1/2009 | |
| CN | 201183157 Y | 1/2009 | |
| CN | 101815378 A | 8/2010 | |
| CN | 102195624 A | 9/2011 | |
| CN | 104104064 A | 10/2014 | |
| CN | 204290295 U | 4/2015 | |
| CN | 104617558 A | 5/2015 | |
| CN | 104934953 A | 9/2015 | |
| CN | 206164075 U | 5/2017 | |
| CN | 107004526 A | 8/2017 | |
| DE | 19534825 | 3/1997 | |
| DE | 102013206412 A1 | 10/2014 | |
| EP | 0846955 | 6/1998 | |
| EP | 2660843 | 11/2013 | |
| JP | H0815337 A * | 1/1996 | |
| JP | 2001037244 A * | 2/2001 | |
| JP | 2017101951 A * | 6/2017 | .......... H02J 13/0004 |
| WO | WO-2010015425 A1 * | 2/2010 | ............ H02H 5/083 |

* cited by examiner

CONTROL UNIT COMPRISING A CIRCUIT, AND METHOD FOR SHORT-CIRCUIT PROTECTION OF GROUND LINES AND SENSORS

BACKGROUND OF THE INVENTION

The invention relates to a control unit comprising a circuit, and a method for short-circuit protection of ground lines and sensors. For the evaluation of resistive sensors, (e.g. NTC temperature sensors, NTC=Negative Temperature Coefficient), it is common practice to use an (additional) first resistor connected in series with the sensor to form a voltage divider, by means of which an analog voltage signal is generated.

The voltage signal can be detected and further processed, for example, with an analog-to-digital converter in a control unit. The voltage divider is designed in such a way that one connector of the sensor is at a ground or reference potential, and the other connector is connected to the first resistor. In this context, the first resistor is often also referred to as a "pull-up resistor". One end of the first resistor facing the sensor is connected to a supply voltage source. The signal, which the control unit measures for evaluating the parameter measured with the sensor, is tapped between the first resistor and the sensor.

Such an arrangement is often used in motor vehicles, for example, in order to allow a control unit, for example, to measure a temperature outside the control unit. A further application of such an arrangement is in hybrid and electric vehicles, in which such arrangements can be used to measure the temperature of electrical machines. The leads that contact the sensor may in some cases run outside of the control unit through the motor vehicle cable harness. But it is also possible that leads are routed from the control unit to the electrical machine via a separate cable.

SUMMARY OF THE INVENTION

In the automotive sector there is a general requirement that the arrangement described above should be able to withstand a short circuit of one of the two sensor leads to which the sensor is connected and the resulting short-circuit current that flows, without incurring damage.

A short-circuit current is understood here in general to mean a current that flows through one of the sensor leads and which exceeds a defined limit current. Such a current can occur, for example, if a high voltage is present on one of the two sensor leads (first sensor lead and second sensor lead). The operating voltage of the on-board power supply, which is 14 Volt, for example, is often already sufficient in the event of a short circuit to this voltage to cause a current to flow, which will overload the sensor, the leads or the circuit.

A short circuit here is defined as an unwanted, low-resistance electrical connection to a signal which can carry a voltage, due to which currents can flow through the sensor, along the leads or into the control unit, which may be significantly greater than the operating currents in normal operation.

In the case of cables that are connected in the control unit with high impedance, hence in which the control unit itself already has a high resistance value, short-circuit protection is often already provided by the high-impedance dimensioning of the circuit in the control unit.

However, there is a risk of overloading and destruction of the sensor caused by a short circuit, since the full on-board power supply voltage (of, for example, 14 volts) can still be applied across the sensor. For example, if the full on-board power supply voltage of 14 volts appears on a first lead of the sensor, which is connected to the side opposite to the grounding, the sensor can be destroyed due to overload because it is not designed for such a voltage.

This problem is exacerbated, e.g. in the case of an NT temperature sensor (NTC=Negative Temperature Coefficient). The resistance of such an NTC temperature sensor continues to fall with increasing temperature rise, so that the waste power is further increased. If the cooling mechanism of the sensor is not sufficient to dissipate this temperature rise, this positive feedback often causes the destruction of the sensor.

In the case of leads that are connected in the control unit with low impedance (e.g. ground leads from sensors), no short-circuit protection is provided independently of the behavior of the sensor. A short circuit to voltages that differ from the reference potential of the control unit (usually the grounding), may give rise to the destruction of the leads to the sensor, the control unit, or the sensor. For reasons of measurement accuracy, however, it is often not possible to dispense with a low-impedance connection of one of the sensor connections.

Using the control unit and the corresponding operating method presented here, both the sensor and low-impedance connected supply cables to the sensor are designed to be protected against overload and destruction in the event of a short circuit. This is to be achieved without a significant loss of measurement accuracy.

The control unit described here for evaluating the sensor signal of a sensor has at least one first sensor connection for connecting the sensor, wherein the first sensor connection is connected to a short-circuit protection circuit which is arranged between the second sensor connection and a grounding, and which comprises a switchable transistor, by way of which the grounding of the second sensor connection can be interrupted. With the switchable transistor of the short-circuit protection circuit, a grounding of the first sensor connection can be interrupted. This can prevent a short-circuit current from occurring through the first sensor connection. The first sensor connection is preferably a low-impedance sensor connection, through which a short-circuit current could quickly develop without the described short-circuit protection circuit.

The transistor is, for example, a MOSFET (MOSFET= Metal Oxide Semiconductor Field Effect Transistor) or a comparable component.

Due to an interruption of the flow of current through the sensor using the transistor, the destruction of the control unit, the sensor or the cable can be prevented. At the same time, given appropriate dimensioning the influence of the short-circuit protection circuit on the accuracy of the sensor evaluation is very small.

As described, the sensor is, in particular, a resistive sensor and particularly preferably a temperature sensor, which in turn is preferably an NTC sensor (NTC=Negative Temperature Coefficient). The short-circuit protection discussed here, however, is not limited to a specific sensor principle. In NTC sensors, however, the advantage of the short-circuit protection circuit described here is particularly effective, because NTC sensors when heated have increasingly lower resistance and the short-circuit current thus continues to rise, if the short-circuit current causes self-heating of the sensor. This increase continues until the sensor or the lead is destroyed. Consequently, in NTC sensors both a short circuit on a ground lead and a short circuit on a signal cable are critical.

The control unit preferably also has a second sensor connection for connecting the sensor and for providing a sensor voltage to operate the sensor, wherein the second sensor connection is connected to a voltage source. The voltage source is used to apply a voltage across the sensor. This voltage is necessary for a measurement current to flow through the sensor, which is required in order to exploit the measurement principle of the sensor.

There are two common variants for the connection of a first sensor lead. According to a first variant the first sensor lead is connected directly to a supply voltage. This is used for the case of an active sensor, which generates its output signal itself. According to a second variant the first sensor lead is connected to the supply voltage via an (additional) (first) resistor.

The first resistor is also referred to, for example, as a "pull-up resistor". This first resistor acts together with the resistance of the sensor as a voltage divider, in order to be able to evaluate the sensor using the sensor signal. This resistor together with the sensor resistance defines the sensor voltage applied across the sensor.

The transistor is arranged in a circuit breaking path, in which a low-impedance second resistor can be located in series with the transistor.

The second low-impedance resistor can also be omitted in variants, or also formed by the transistor, which usually also has a (low-impedance) internal resistance.

If the transistor is closed and a short-circuit current can flow through the transistor, this low-ohmic resistance helps to limit the short-circuit current. The designation "low-ohmic" here means, in particular, that this resistance is low in comparison to the first resistance and the third resistance to be described in the following.

A current limit can prolong the response time by which a short circuit must be detected and the transistor of the short-circuit protection circuit must be opened. Current limiting can be provided by the optional second resistor, because it causes a negative feedback of the transistor current. A certain amount of current limiting is also provided without the use of the second resistor, because depending on the gate-source voltage that is set the transistor is operated in the pinch-off region during a short circuit and thus also has a current-limiting effect. In particular, however, in the pinch-off region MOSFETs no longer behave like a resistance.

Depending on the dimensioning of the transistor and its gate voltage, a permanent robustness against short circuits can thus also be implemented. To achieve this the gate of the transistor can be placed at a fixed potential and an intelligent control of the gate via a control circuit could be omitted. This (simple) circuit is also called a "clamping circuit".

In addition, it is advantageous if the short-circuit protection circuit has a bypass path by way of which the transistor is bridged and in which a high-impedance third resistor is located.

The designation "high-impedance" here means that the third resistor is very large, especially in comparison with the second resistor and the first resistor. This resistor leads to a permanent current drain, regardless of whether the transistor is open or not.

This third resistor is also referred to as a pull-down resistor. The third resistor makes it possible to distinguish whether a short circuit exists on one lead to the sensor or on a second lead to the sensor when the transistor is open.

The control unit preferably comprises an evaluation circuit, to which at least the first sensor connection is connected and which is configured to evaluate a sensor signal from a sensor connected to the first sensor connection. The signal on the second sensor connection (between pull-up and sensor) is primarily intended for evaluating the sensor. Optionally, the signal on the first sensor connection between sensor and protection circuit can be additionally used for the evaluation, as will also be described in detail below.

The evaluation circuit can also be configured to evaluate the sensor signal of a sensor connected to a second sensor connection, for which purpose a second sensor connection can be connected to the evaluation circuit.

The first sensor connection and the second sensor connection are preferably connected to mutually opposite poles, ends or terminals of the sensor. A sensor voltage between the first sensor connection and the grounding is designated as the first sensor signal. A sensor voltage between the second sensor connection and the grounding is designated as the second sensor signal. The difference voltage between the first sensor signal and the second sensor signal is designated as the second sensor signal.

To evaluate the sensor via a first sensor signal, the transistor is closed. The transistor and the second resistor, if present, are preferably so dimensioned with a low impedance that the voltage drop across the second resistor and the transistor is negligible in comparison to the voltage drop across the sensor and the first resistor.

If the voltage drop across the transistor and the second resistor is not negligible and not sufficiently known, the second sensor signal between the first sensor connection and the second sensor connection can also be evaluated. For evaluating resistive sensors the signal between the sensor and the pull-up resistor is sufficient if the resistance of the transistor and the resistor below the transistor are known.

The control unit comprises a control circuit, with which the short-circuit protection circuit (or the transistor of the short-circuit protection circuit) can be controlled to prevent a short circuit.

A short circuit detection can be carried out, in particular, in accordance with the following variants:

evaluation of voltage drop across the transistor and resistor and comparison with threshold/expected values, evaluation of voltage on the sensor signal between sensor and first resistor (pull-up resistor) and comparison with threshold/expected values, or detection of the voltage drops across the resistors, as well as calculation of the currents and current differences. If there is no short circuit present, the currents are equal. If a short circuit is present, the current that flows through the short circuit into or out of the circuit ensures a difference between the currents.

The interruption of the short-circuit protection circuit or the grounding prevents any further short circuit.

The control of the transistor by means of a control circuit requires the detection of a short circuit. This can be achieved via the first lead and the second lead, or on the basis of the described first sensor signal and/or the described second sensor signal. To detect a short circuit the transistor is preferably open.

The test of whether a short circuit is present on the first lead or the second lead is also called "pin-pointing". To test whether a short circuit is present on the first lead or the second lead, the third resistor is used. If the third resistor is not present and the transistor is open, the same voltages are applied to the first lead and on the second lead in both short circuit cases (short circuit on the first lead and short circuit on the second lead), since no current can flow through the sensor. No distinction is possible in this case. If the third resistor is present, then different voltages arise depending on whether there is a short circuit on the first lead or the second lead. This makes it possible to distinguish between a short circuit on the first lead or a short circuit on the second lead.

Also described here is a method for operating a sensor comprising a control unit as claimed in any one of the preceding claims, having at least one of the following measures:

closing the transistor if it has been detected that there is no short circuit present, opening the transistor if it has been detected that a short circuit is present, closing the transistor before a measuring time, performing a measurement with the sensor and subsequently opening the transistor.

The measures described can be carried out individually or in combination in order to obtain an effective short-circuit protection for a sensor using the control unit described.

In the operation of the sensor a short circuit is particularly advantageously detected when an unexpected difference exists between a first sensor signal at a first sensor connection and a grounding, and a second sensor signal between a first sensor connection and a second sensor connection.

The method is also particularly advantageous if in order to detect a short circuit the voltage drop across at least one first resistor or a second resistor is detected by a control unit. It is also possible to measure both the voltage drop across the first resistor and the voltage drop across the second resistor in order to detect a short circuit particularly accurately.

In addition, the method is particularly beneficial if the voltage drops are compared with threshold values in order to detect a short circuit.

The method is particularly advantageous if the change in at least one voltage drop is compared with at least one threshold value in order to detect a short circuit.

In addition, by means of two detected voltage drops across a first resistor and/or a second resistor, the currents through the first resistor or the second resistor in a control unit can be calculated. By comparing the difference between the currents, a short circuit can be detected.

In accordance with a further mode of operation the transistor remains permanently closed. In the event of a short circuit, the current through the sensor, the transistor and the second resistor is (passively) limited to an acceptable level.

BRIEF DESCRIPTION OF THE DRAWINGS

The invention will be explained hereafter in further detail by reference to the figures. It should be noted that the proportions shown in the figures are only schematic. Features from the figures can be used in any combination. Shown are.

DETAILED DESCRIPTION

Figure 1:
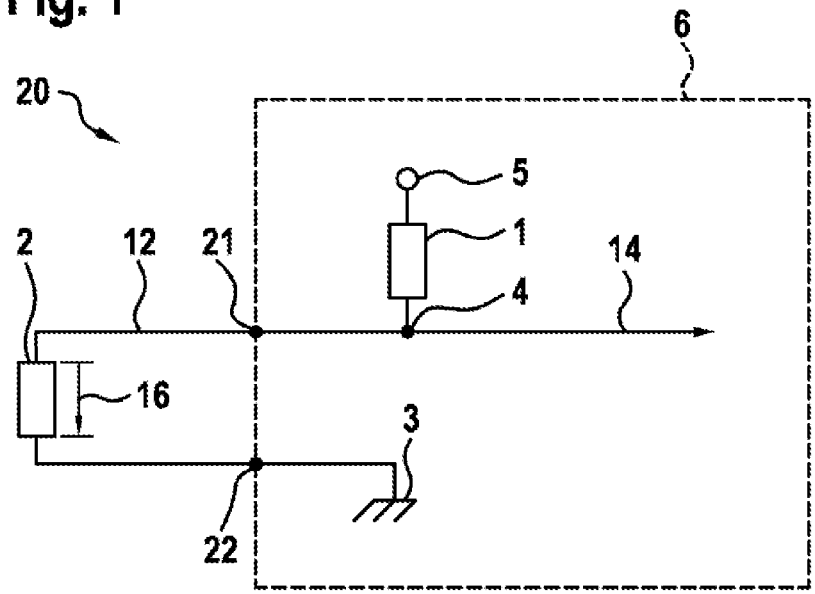
FIG. 1: a known control unit for the evaluation of a sensor.

FIG. 1 shows a control unit 6 which has a first sensor connection 21 for connecting a first lead 12 of a sensor 2 and a second sensor connection 22 for connecting a second lead 13 of a sensor 2. The second sensor connection 22 is connected to a grounding 3 to the side of or inside the control unit 6. The first sensor connection 21 is connected to a supply voltage source 5 to the side of or inside the control unit 6, wherein another first resistor 1 is arranged between the supply voltage source 5 and the first sensor connection 21 or the sensor 2. Within the control unit 6 between the first resistor 1 and the sensor 2, a signal connection 4 is present, from which a first sensor signal 14 of the sensor 2 can be tapped for evaluation.

Figure 2:
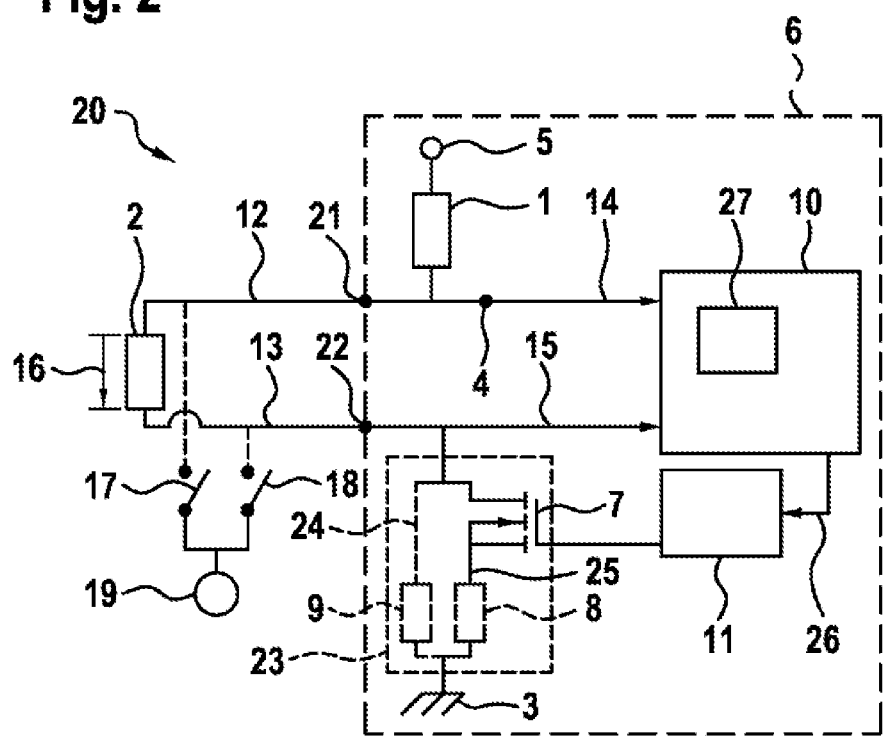
FIG. 2: the control unit described here for the evaluation of a sensor.

The control unit 6 described here and shown in FIG. 2 is designed according to the control unit 6 in FIG. 1. In addition, however, between the second sensor connection 22 or the sensor 2 and the grounding 3 it has a short-circuit protection circuit 23 which protects the sensor 2 and the control unit 6 as well as the leads (in particular the first lead 12 and the second lead 13) against short circuits.

The short-circuit protection circuit 23 has two parallel paths, namely a circuit breaking path 25 and a bypass path 24, which are arranged parallel to each other and form a grounding of the second sensor connection 22. The bypass path 24 has a high-impedance third resistor 9. The circuit breaking path 25 has a transistor 7 and a low-impedance second resistor 8. The circuit breaking path 25 can be selectively opened and closed with the transistor 7 to obtain a short-circuit protection as appropriate.

The two possible short circuit cases are shown schematically in FIG. 2 on the basis of the short-circuit voltage source 19, which can apply a potential to the sensor 2 or to the control unit 6. Shown in the form of switches are a first short circuit 17 on the first lead 12 and a second short circuit 18 on the second lead 13.

The control unit 6 shown in FIG. 2 allows not only a first sensor signal 14 to be evaluated, which can also be evaluated with the control unit 6 in accordance with FIG. 1, but also the evaluation of a second sensor signal 15, which forms a difference signal between the first sensor connection 21 and the second sensor connection 22. For the evaluation an evaluation circuit 10 is also shown here, which usually also comprises an analog-to-digital converter 27, with which the analog voltage signal of the sensor 2 can be converted into a digital signal for further evaluation. Also shown here is a control circuit 11, which can control the transistor 7 and which can receive from the evaluation circuit 10 a signal 26 relating to the voltages occurring on the first connection 21 and on the second connection 22 in order to detect a short circuit and to open the transistor 7 or close it again, as appropriate.

The invention claimed is:

1. A control unit (6) for evaluating the sensor signal of a sensor (2), the control unit comprising:

at least one first sensor connection (21) and a second sensor connection (22) for connecting the sensor (2), wherein the second sensor connection (22) is connected to a short-circuit protection circuit (23), which is arranged between the second sensor connection (22) and a grounding (3), and which comprises a switchable transistor (7), by way of which the grounding (3) of the second sensor connection (22) can be interrupted;

a control circuit (11), by way of which the short-circuit protection circuit (23) is controlled to prevent a short circuit, wherein the control circuit (11) is configured to interrupt the short-circuit protection circuit (23) when an unexpected difference exists between a first sensor signal (14) at the first sensor connection (21) and a grounding (3), and a second sensor signal (15) between the first sensor connection (21) and the second sensor connection (22).

2. The control unit (6) as claimed in claim 1, wherein the control unit also comprises a first sensor connection (21) for connecting the sensor (2) and for providing a sensor voltage to operate the sensor (2), wherein the first sensor connection (21) is connected to a supply voltage source (5).

3. The control unit (6) as claimed in claim 2, wherein a first resistor (1) is arranged between the supply voltage source (5) and the sensor (2).

4. The control unit (6) as claimed in claim 1, wherein the transistor (7) is arranged in an circuit breaker path (25) in which a low-impedance resistor (8) is placed in series with the transistor (7).

5. The control unit (6) as claimed in claim 1, wherein the short-circuit protection circuit (23) comprises a bypass path (24), by way of which the transistor (7) is bypassed and in which a high-impedance resistor (9) is placed.

6. The control unit (6) as claimed in claim 1, comprising an evaluation circuit (10), to which at least the first sensor connection (21) is connected, and which is configured to evaluate a sensor signal from a sensor (2) connected to the first sensor connection (21).

7. The control unit (6) as claimed in claim 6, wherein the evaluation circuit (10) is additionally connected to the second sensor connection (22) and which during the evaluation of a sensor signal of a sensor, which is connected to the first sensor connection (21) and to the second sensor connection (22), can access either a sensor voltage (16) between the first sensor connection (21) and a grounding (3), or a sensor voltage (16) between the first sensor connection (21) and the second sensor connection (22).

8. A method for operating a sensor (2) comprising
a control unit (6) that includes at least one first sensor connection (21) and a second sensor connection (22) for connecting the sensor (2), wherein the second sensor connection (22) is connected to a short-circuit protection circuit (23), which is arranged between the second sensor connection (22) and a grounding (3), and a switchable transistor (7), by way of which the grounding (3) of the second sensor connection (22) can be interrupted, the method comprising:
closing the transistor before a measuring time,
performing a measurement with the sensor,
subsequently opening the transistor, and
detecting whether a short circuit is present,
closing the transistor when no short circuit is present,
leaving the transistor open when a short circuit is present,
wherein the short circuit protection circuit (23) is configured to protect the sensor (2) against a voltage overload due to a short circuit by opening the switchable transistor (7).

9. The method for operating a sensor (2) as claimed in claim 8, wherein, to detect a short circuit, the voltage drop across at least one first resistor (1) or a second resistor (8) is detected by the control unit (27).

10. The method for operating a sensor (2) as claimed in claim 9, wherein the one or more voltage drops are compared with threshold values in order to detect a short circuit.

11. The method for operating a sensor (2) as claimed in claim 9, wherein a change in at least one voltage drop is compared with at least one threshold value in order to detect a short circuit.

12. The method for operating a sensor (2) as claimed in claim 9, wherein by means of two voltage drops detected across a first resistor (1) or a second resistor (8) the currents through the first resistor (1), the second resistor (8), or both the first resistor (1), the second resistor (8) are calculated in a control unit (27) and by comparing the difference between the currents a short circuit can be detected.

13. The method for operating a sensor (2) as claimed in claim 8, wherein the control circuit (11) is configured to control the short-circuit protection circuit (23) to prevent a short circuit.

14. The method for operating a sensor (2) as claimed in claim 13,
wherein the control circuit (11) is further configured to interrupt the short-circuit protection circuit (23) when an unexpected difference exists between
a first sensor signal (14) at the first sensor connection (21) and the grounding (3), and
a second sensor signal (15) between the first sensor connection (21) and the second sensor connection (22).

* * * * *